(12) United States Patent
Chinthakindi et al.

(10) Patent No.: US 7,670,921 B2
(45) Date of Patent: Mar. 2, 2010

(54) STRUCTURE AND METHOD FOR SELF ALIGNED VERTICAL PLATE CAPACITOR

(75) Inventors: Anil K. Chinthakindi, Haymarket, VA (US); Douglas D. Coolbaugh, Essex Junction, VT (US); Timothy J. Dalton, Ridgefield, CT (US); Ebenezer E. Eshun, Newburgh, NY (US); Jeffrey P. Gambino, Westford, VT (US); Anthony K. Stamper, Williston, VT (US); Richard P. Volant, New Fairfield, CT (US)

(73) Assignee: International Business Machines Corporation, Armonk, NY (US)

( * ) Notice: Subject to any disclaimer, the term of this patent is extended or adjusted under 35 U.S.C. 154(b) by 455 days.

(21) Appl. No.: 11/616,955

(22) Filed: Dec. 28, 2006

(65) Prior Publication Data

US 2008/0158771 A1    Jul. 3, 2008

(51) Int. Cl.
*H01L 21/4763* (2006.01)
(52) U.S. Cl. .............. 438/398; 438/240; 438/638; 257/E21.02
(58) Field of Classification Search .............. 257/E21.02
See application file for complete search history.

(56) References Cited

U.S. PATENT DOCUMENTS

| | | | |
|---|---|---|---|
| 4,129,848 A | 12/1978 | Frank et al. | |
| 5,414,404 A | 5/1995 | Jeong et al. | |
| 5,485,138 A | 1/1996 | Morris | |
| 5,804,484 A | 9/1998 | Wen | |
| 6,228,707 B1 * | 5/2001 | Lin | 438/250 |
| 6,316,325 B1 | 11/2001 | Lee | |
| 6,387,750 B1 | 5/2002 | Lai et al. | |
| 6,426,268 B1 | 7/2002 | Huppert et al. | |
| 6,559,004 B1 | 5/2003 | Yang et al. | |
| 6,607,962 B2 | 8/2003 | Zekeriya et al. | |
| 6,645,821 B2 | 11/2003 | Bailey et al. | |
| 6,737,326 B2 | 5/2004 | Steinmann et al. | |
| 6,819,217 B2 | 11/2004 | Wienand et al. | |
| 6,825,080 B1 | 11/2004 | Yang et al. | |
| 6,993,828 B2 | 2/2006 | Ha et al. | |
| 7,015,110 B2 * | 3/2006 | Ning | 438/396 |
| 7,071,054 B2 * | 7/2006 | Park | 438/243 |

(Continued)

OTHER PUBLICATIONS

U.S. Appl. No. 11/162,218, filed Sep. 1, 2005.

*Primary Examiner*—Stephen W Smoot
(74) *Attorney, Agent, or Firm*—Cantor Colburn LLP; Katherine Brown

(57) ABSTRACT

A method of forming a metal-insulator-metal (MIM) capacitor includes forming a first planar dielectric layer with a first metallization layer therein; forming a first passivation layer on top thereof; forming a planar conductive layer above the first passivation layer; patterning and selectively removing the conductive layer up to the first passivation layer in designated areas to form a set of conductive features; patterning and conformally coating the set of conductive features and the exposed first passivation layer with a high strength dielectric coating; disposing a second dielectric layer above the first passivation layer and enclosing the set of conductive features; patterning and selectively removing portions of the second substrate to form channels and trenches; performing a dual-Damascene process to form a second metallization layer in the trenches and channels and to form an upper conductive surface above the high strength dielectric coating.

12 Claims, 6 Drawing Sheets

U.S. PATENT DOCUMENTS

| | | |
|---|---|---|
| 7,242,074 B2 | 7/2007 | Erickson et al. |
| 2004/0087164 A1 | 5/2004 | Bao et al. |
| 2004/0245575 A1 | 12/2004 | Beech et al. |
| 2004/0248372 A1* | 12/2004 | Tsau ............................ 438/396 |
| 2006/0014356 A1* | 1/2006 | Hsu et al. .................... 438/393 |

* cited by examiner

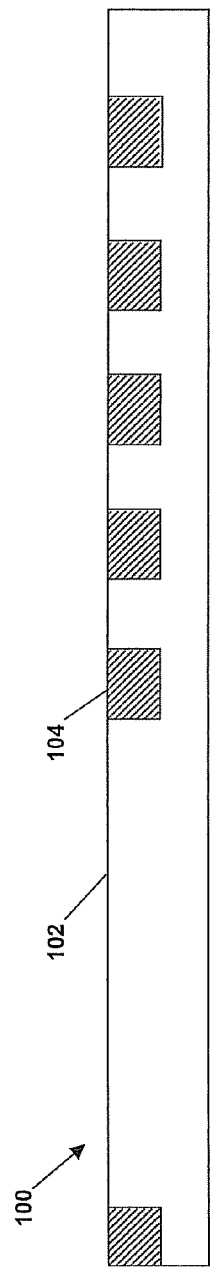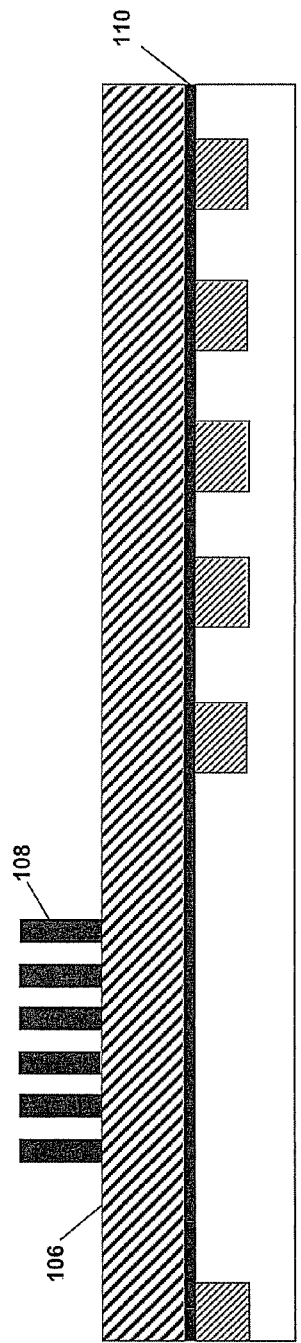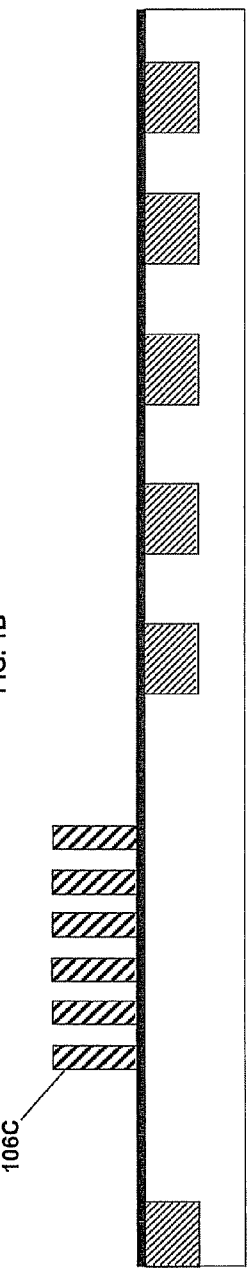

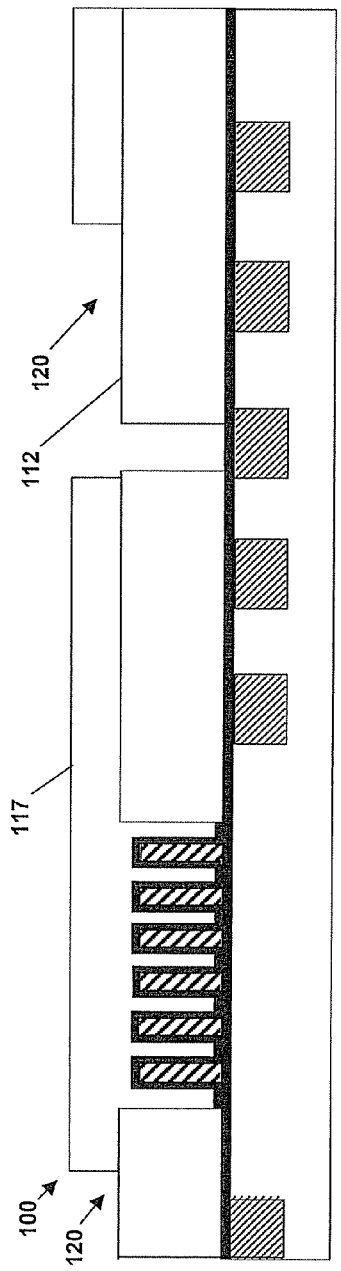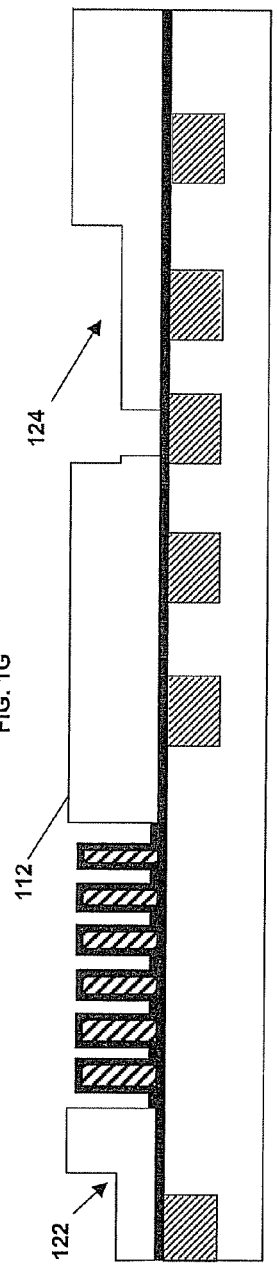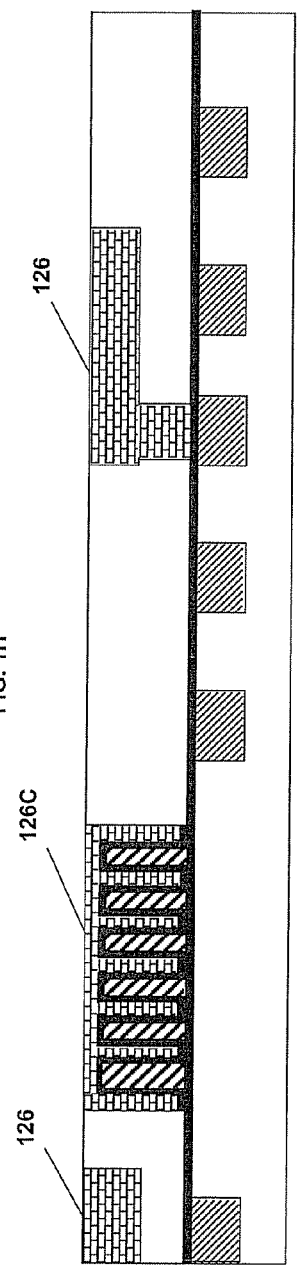

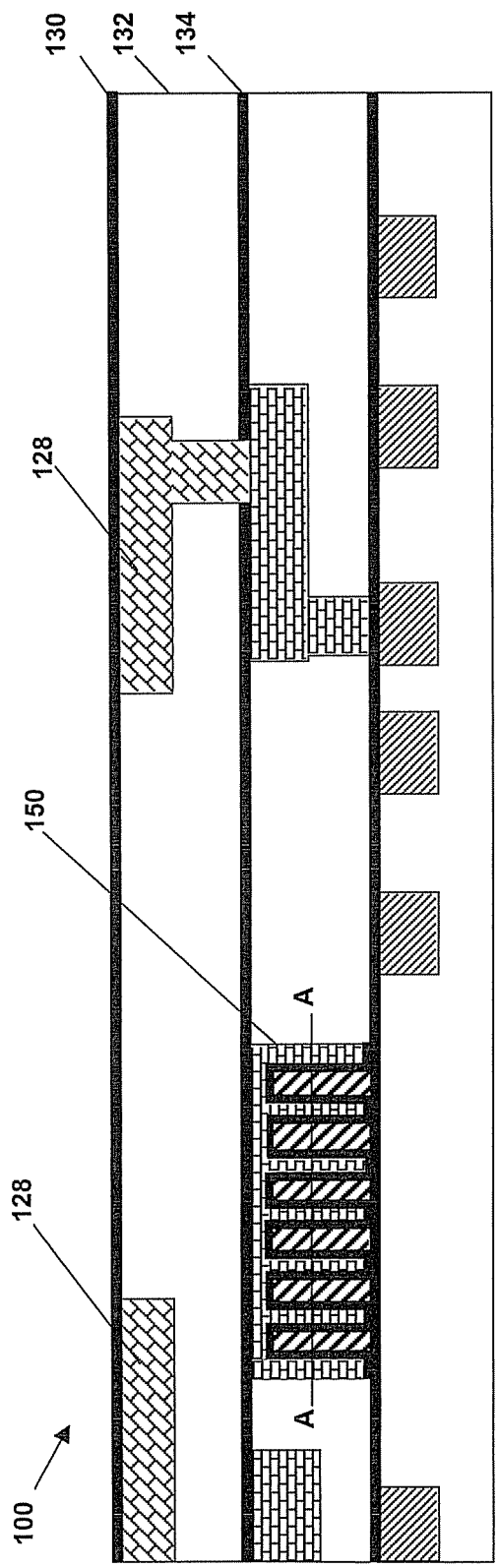
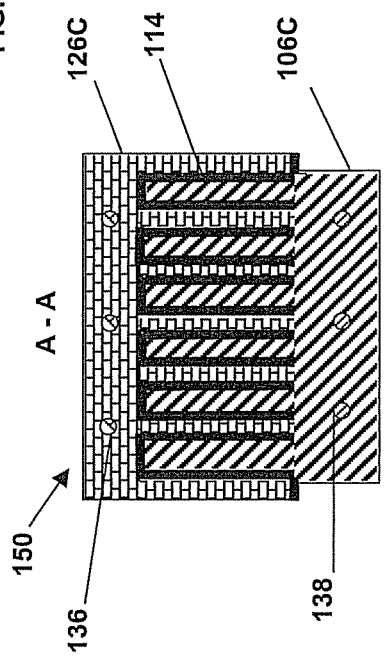
FIG. 1J
FIG. 1K

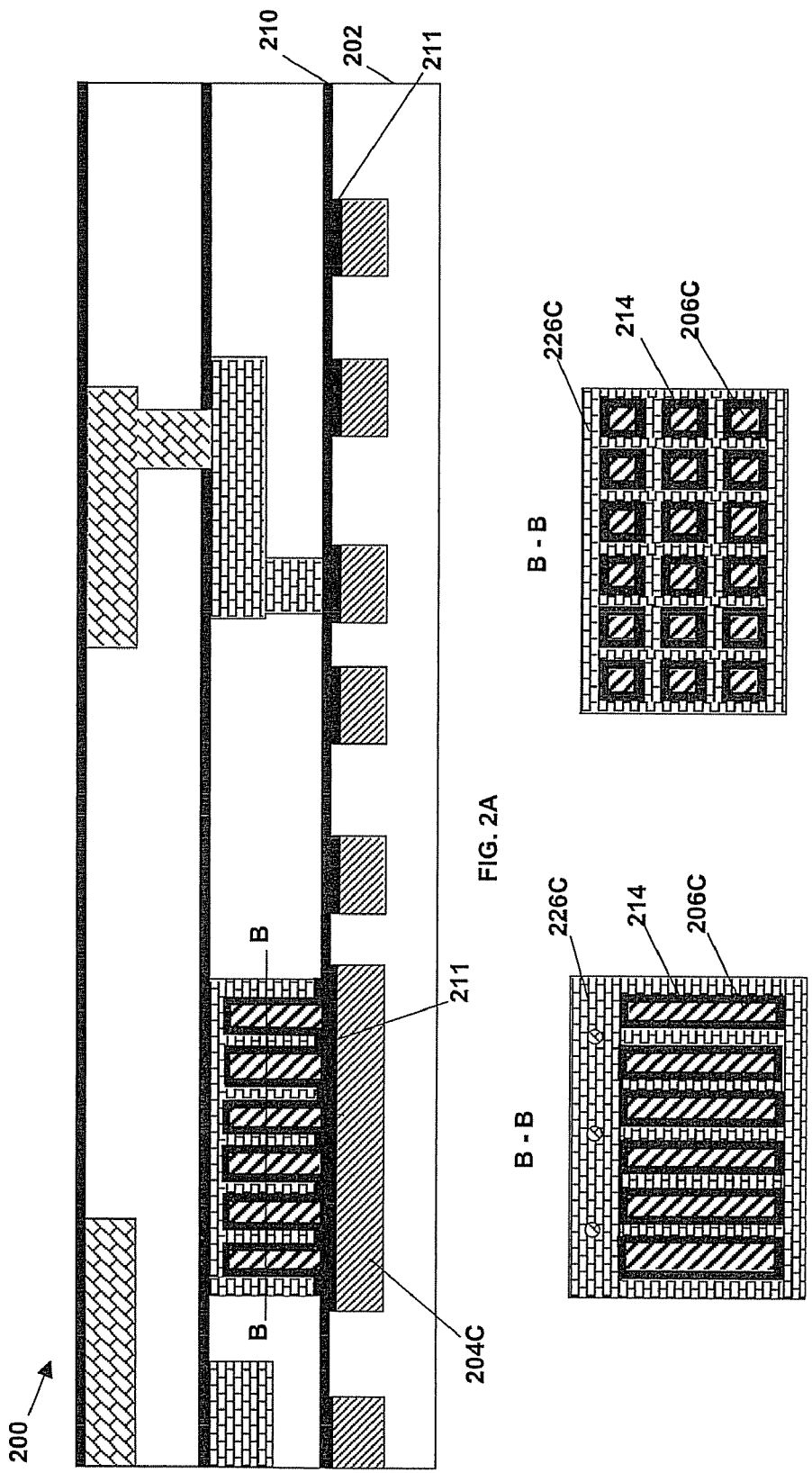
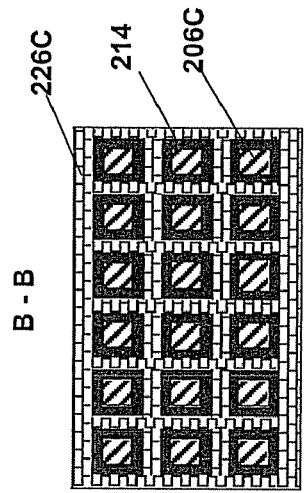
FIG. 2A
FIG. 2B
FIG. 2C

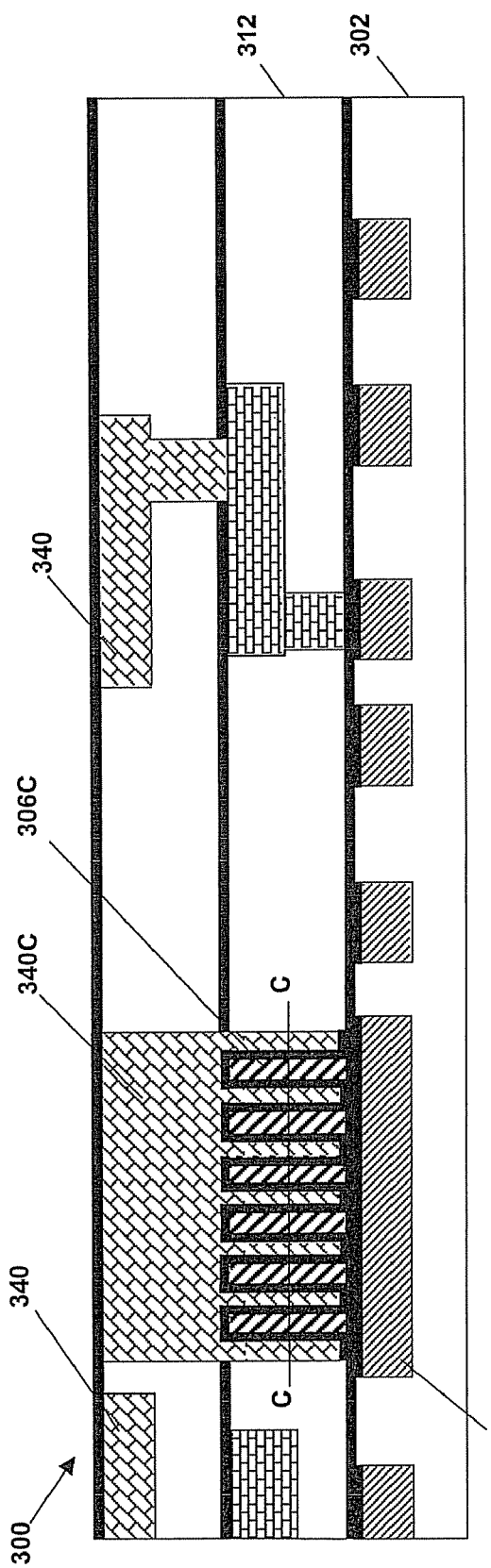
FIG. 3A
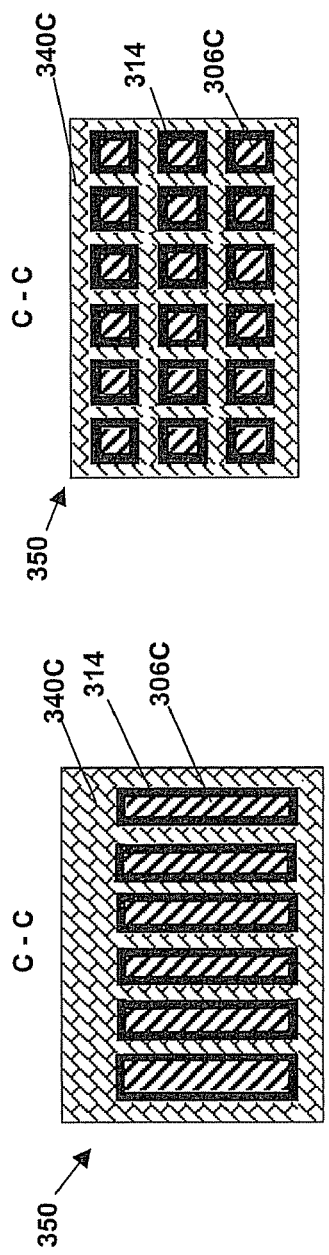
FIG. 3B
FIG. 3C

STRUCTURE AND METHOD FOR SELF ALIGNED VERTICAL PLATE CAPACITOR

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

1. Field of the Invention

This invention relates generally to metal-insulator-metal (MIM) capacitors, and more particularly to a method for forming an enhanced MIM capacitor having a three dimensional structure with an increased and more tightly controlled capacitance and reduced parasitics without occupying additional area over existing three dimensional MIM capacitor designs.

2. Description of the Background

In high frequency applications, the elimination of parasitic resistance in capacitor electrodes is a critical factor in controlling the frequency dependence of the capacitor. Metal-insulator-metal (MIM) capacitors have low electrode resistances, and have been implemented in integrated circuits requiring high-speed performance. In addition, MIM capacitors have capacitance values that have a low correlation to voltage and temperature variation, thereby providing consistent performance over a wide operating range. A traditional approach to constructing a MIM capacitor utilizes two horizontal parallel conductive plates (electrodes) separated by a dielectric. However, the horizontal plate MIM capacitor required a relatively large surface area to implement a given capacitance value, and in a high-density integrated circuit environment surface area (real estate) is at a premium. The relatively large surface area of the horizontal plate MIM capacitor also leads to additional coupling noise between the MIM capacitor and surrounding dielectric substrate, which is not desirable in RF (radio frequency) applications.

In an effort to achieve higher specific capacitance values (capacitance per unit area) three dimensional capacitors have been constructed. The three dimensional capacitors add a vertical dimension to the two dimensional horizontal plate capacitor construction. The three dimensional capacitor construction provides for areas of additional overlap of the conductive plates in a given footprint, thereby increasing the overall specific capacitance. Existing three dimensional MIM capacitor constructs include interlocking digits or fingers separated by a dielectric, where the interlocking fingers form the electrodes. A second variation has pillars that extend from the face of one electrode, and are surrounded by the second electrode, with a dielectric disposed between the two electrode formations. Examples of these three dimensional MIM capacitors are presented in U.S. Pat. No. 6,825,080 (Yang et al.).

However, the three dimensional MIM capacitors presented by Yang et al. employ a partial subtractive etch processes to form the trenches that serve as a receptacle for the second electrode. Yang et al. rely on a timed subtractive etch with no etch stop, which can lead to a variance in trench depth, and an ensuing capacitance variability. In addition, the subtractive etch of Yang et al. is designed to only extend between 24 and 80 percent of the thickness of the conductive layer forming the bottom electrode of the MIM capacitor, thereby limiting the potential amount of overlap between the top and bottom electrodes and the resultant specific capacitance. Finally, the MIM capacitors proposed by Yang et al. are formed above the wiring layer metal, and require vias to connect to the top electrode, potentially introducing additional parasitic affects (i.e. lead inductance) to the circuit.

SUMMARY OF THE INVENTION

Embodiments of the present invention comprise a method of forming a metal-insulator-metal (MIM) capacitor. The method comprises: forming a first metallization layer in a first dielectric layer; forming a first passivation layer on top of the first dielectric layer; forming a planar conductive layer above the first passivation layer; patterning and selectively removing the conductive layer in designated areas to form a set of conductive features electrically coupled at one end, wherein the selective removing results in the conductive material being completely removed in the designated areas up to the first passivation layer; forming a second dielectric layer above the first passivation layer and enclosing the set of conductive features; patterning and selectively removing the second dielectric layer to expose the set of conductive features; patterning and conformally coating the set of conductive features and the exposed first passivation layer with a high strength dielectric coating; patterning and selectively removing portions of the second substrate to form channels; patterning and selectively removing portions of the second substrate to from trenches; performing a dual-Damascene process to form a second metallization layer in the trenches and channels and to form an upper conductive surface above the high strength dielectric coating disposed above the set of conductive features; wherein the set of conductive features forms a lower electrode, and the upper conductive surface forms an upper electrode of the MIM capacitor.

A three dimensional MIM capacitor structure for a multi-level integrated circuit, where the multi-level integrated circuit has a series of metallization layers and passivation layers. A metallization layer further comprises a dielectric layer; and metallization features formed in the dielectric layer. The passivation layers are disposed between the metallization layers. The MIM capacitor further comprises: a lower electrode, a high strength dielectric layer, and an upper electrode. The lower electrode has a series of parallel fingers extending from a common end point and is disposed in the dielectric layer. The lower electrode extends upward from a first passivation layer and is covered by the high strength dielectric. The upper electrode is interleaved with the lower electrode so as to cover all the upper and side surfaces of the lower electrode. The MIM capacitor is completely formed in a single layer of the multilevel integrated circuit.

Additional embodiments of the three dimensional MIM capacitor structure that is constructed in a multilevel integrated circuit, where the lower electrode further comprises a base plate formed in a first metallization layer. A pattern of features extends upward from the base plate into a second metallization layer to complete the lower electrode. A high strength dielectric layer is disposed over the pattern of features. The upper electrode is interleaved with the lower electrode so as to cover all the upper and side surfaces of the pattern of features. The upper electrode is formed in said second metallization layer of the multilevel integrated circuit.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, a solution is technically achieved in which three dimensional MIM capacitors are implemented in an integrated circuit. The three dimensional MIM capacitors and the surrounding integrated circuit are realized with reactive ion etching (RIE), nano-templates, Damascene, dual-Damascene, and deposition processes. The resultant three dimensional MIM capacitors have a higher specific capacitance than existing three dimensional MIM capacitors, as well as a more consistent capacitance value. The higher specific capacitance and the more consistent capacitance value are achieved by fully etching through the conductive layer forming the bottom electrode. The three dimensional MIM capacitors are formed below the wiring layer metal, eliminating the requirement to use vias (which potentially introduce parasitics) to connect to the top electrode.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIGS. 1A-1J are a sequence of cross sectional views illustrating a method of forming a MIM capacitor structure, in accordance with an embodiment of the invention.

FIG. 1K is a top down view of the MIM capacitor along section A-A as defined in FIG. 1J.

FIG. 2A is a cross sectional view of an integrated circuit with the bottom portion of the lower electrode of the MIM capacitor formed in the first dielectric carrier layer during the first metallization process, in accordance with an alternative embodiment of the invention.

FIG. 2B is a top down view of a MIM capacitor with the lower electrode formed as elongated fingers along section B-B as defined in FIG. 2A.

FIG. 2C is a top down view of a MIM capacitor with the lower electrode formed as pillars along section B-B as defined in FIG. 2A.

FIG. 3A is a cross sectional view of an integrated circuit with the bottom portion of the lower electrode of the MIM capacitor formed in the first dielectric carrier layer during the first metallization process, and the top electrode of the MIM capacitor formed during the third metallization process, in accordance with an alternative embodiment of the invention.

FIG. 3B is a top down view of a MIM capacitor with the lower electrode formed as elongated fingers along section C-C as defined in FIG. 3A.

FIG. 3C is a top down view of a MIM capacitor with the lower electrode formed as pillars along section C-C as defined in FIG. 3A.

The detailed description explains the preferred embodiments of the invention, together with advantages and features, by way of example with reference to the drawings.

DETAILED DESCRIPTION OF SPECIFIC EMBODIMENTS

Embodiments of the present invention provide a structure and method for three dimensional MIM capacitors to be implemented in an integrated circuit. The three dimensional MIM capacitors and the surrounding integrated circuit are realized with reactive ion etching (RIE), damascene, dual damascene, and deposition processes. The resultant three dimensional MIM capacitors have a higher specific capacitance than existing three dimensional MIM capacitors, as well as a more consistent capacitance value. The higher specific capacitance and the more consistent capacitance value are achieved by fully etching through the conductive layer forming the bottom electrode. Additional height is achieved for the lower electrode, by forming the upper electrode in a separate metallization layer, thereby increasing the vertical contribution to the specific capacitance of the MIM capacitor. The three dimensional MIM capacitors are formed below the wiring layer metal, eliminating the requirement to use vias (which potentially introduce parasitics) to connect to the top electrode.

It is to be understood and appreciated that the process steps and structures described below do not cover a complete process flow. The present invention can be practiced in conjunction with various integrated circuit fabrication techniques that are used in the art, and only so much of the commonly practiced process steps are included herein as are necessary to provide an understanding of the present invention.

Figure 1D:
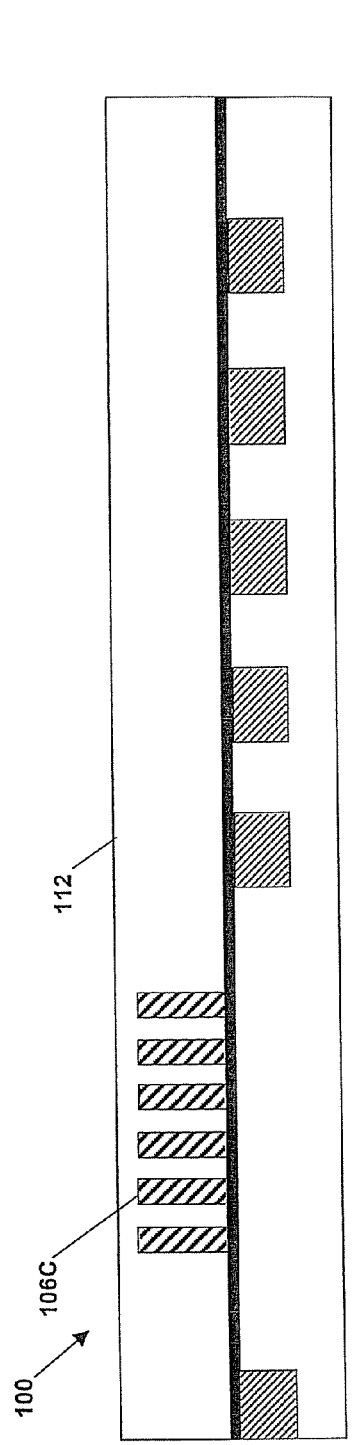

FIGS. 1A-1K provide a description of the formation of a three dimensional MIM capacitor 150 (see FIG. 1J) in an integrated circuit 100 according to a first embodiment of the present invention. As shown in FIG. 1A a first dielectric layer 102 with a first metallization layer 104 is formed with conventional circuit forming and etching techniques (e.g., lithography, RIE, metal deposition, chemical-mechanical polishing (CMP), etc.). The first dielectric layer 102 (as are the other dielectric layers going forward—unless otherwise noted) is comprised of materials generally used for inter-layer dielectrics (ILD) in semiconductor manufacturing including $SiO_2$ and SiCOH, for example. The first metallization layer 104 (as are the other metallization layers going forward—unless otherwise noted) may include one or more layers of conductive material such as Al, Cu, Ti, Ta, and alloys thereof, etc. In FIG. 1B a passivation layer 110, which also acts as an etch stop, may include materials such as SiC or $Si_3N_4$ and is disposed atop the first dielectric layer 102 and first metallization layer 104. A conductive metallization layer 106 is disposed atop the passivation layer 110. The conductive layer 106 is masked by resist layer 108 and patterns the lower electrode formation 106C (FIG. 1C) of the MIM capacitor 150. In FIG. 1C the conductive layer 106 is completely etched away, except for the areas defined by resist layer 108. The lower electrode formation 106C extends from the top of the conductive layer 106, and terminates at the passivation layer 110, which also serves as an etch stop.

Figure 1E:
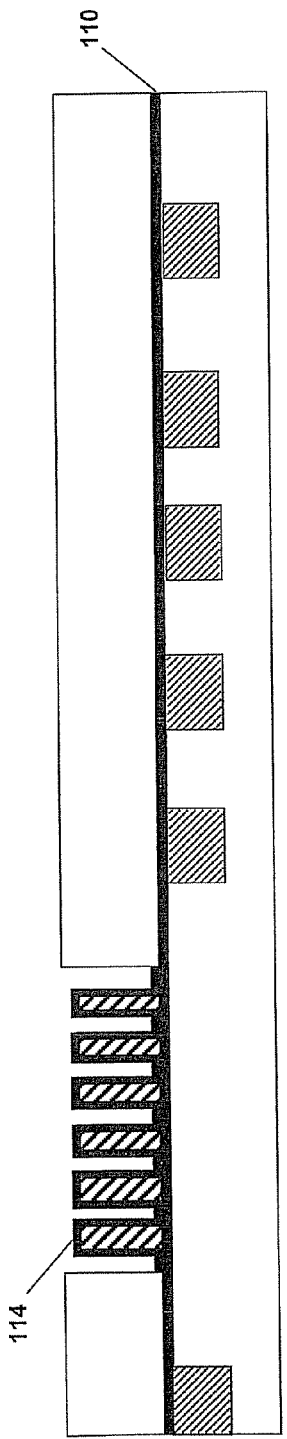

Referring to FIGS. 1D and 1E a second dielectric layer 112 is disposed on top of the lower electrode formation 106C, and is selectively etched away to expose the area that will define where the upper electrode of the MIM capacitor 150 will be formed. A high dielectric constant (k) dielectric layer 114 is disposed over the exposed areas of the passivation layer 110 and the lower electrode formation 106C. Materials used for the high dielectric constant (k) dielectric layer 114 may include oxide, $Al_2O_3$, $Si_3N_4$, SiN, SiC, $SiO_2$, $Ta_2O_5$, $TiO_2$, $Y_2O_3$, and ferroelectric materials. A chemical vapor deposition (CVD) process or atomic layer deposition (ALD) process can be utilized to ensure an even, uniform, and complete coverage by the high k dielectric layer 114.

Figure 1F:
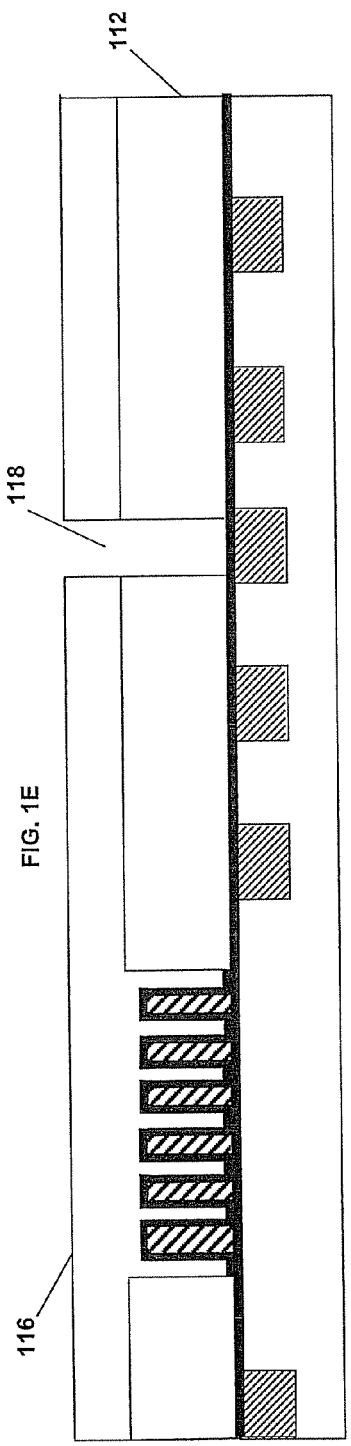

In FIG. 1F a resist layer 116 is patterned so as to allow the formation of a channel 118 in the second dielectric layer 112 that will be utilized as a via. In FIG. 1G a new resist layer 117 is patterned in areas 120 to facilitate the formation of trenches 122 and 124 in the second dielectric layer 112 (FIG. 1H).

In FIG. 1I a second metallization layer 126 is formed, as well as the upper electrode formation 126C for the MIM capacitor 150. A dual-Damascene process with metal deposition and CMP can be utilized to fill trenches 122 and 124 and channel 118 of FIG. 1H, as well as the upper electrode 126C. Note that the metal layers 126 and 126C consist of a refractory metal liner, such as Ta, TaN, TiN, or W, and a Cu conductor. The refractory metal is a diffusion barrier that prevents Cu from diffusing into the dielectric. One or more liner layers may be used to optimize the interface between the metal and the capacitor dielectric. By decoupling the via and trench metallization process, used to form layers 126, from the lower electrode metallization process, used to form layers 106C, it is possible to optimize both the capacitor properties and the via properties. For example, the lower electrode can be formed from a material such as TiN, TaN, Pt, etc., that is compatible with the capacitor dielectric, 114, providing a capacitor that has high yield and high reliability. At the same time, the via channel 118, can be filled with a high conductivity material, such as Cu. If the same material was used for both the lower electrode and the filling of the vias, it would not be possible to optimize simultaneously, capacitor yield and reliability and via resistance.

FIG. 1J illustrates the completed integrated circuit 100 with an optional third layer. The third layer is formed above a passivation layer 134, and comprises a third dielectric layer 132, a third metallization layer 128, and a passivation layer 130. The completed MIM capacitor 150 is cross-sectioned along line A-A and is shown in FIG. 1K.

A top down view of the cross-section A-A of the MIM capacitor 150 is illustrated in FIG. 1K and illustrates the interleaved fingers of the lower and upper electrodes (106C and 126C, respectively). Vias 138 serve as connections for linking the lower electrode 106C to the second metallization layer 126. The upper electrode 126C can be joined directly to the second metallization layer 126 or the optional third layer metallization 128 with vias 136.

Although the exemplary process described above for the formation of the lower electrode of the MIM capacitor 150 was a subtractive etch, a Damascene process could also be utilized to form the lower electrode, as was done in the formation of the upper electrode.

The interleaved finger MIM capacitor 150 as constructed allows for wiring to run in the first metallization layer 104 and underneath the capacitor thereby reducing required circuit area.

FIGS. 2A-2C illustrate an alternative embodiment of the structure of FIG. 1J. In the integrated circuit 200 of FIG. 2A a plate forms the bottom portion 204C of the lower electrode 206C, and is formed in the first dielectric layer 202. The bottom portion 204C facilitates two additional embodiments of a MIM capacitor according to the present invention, which are respectively shown in the top down view of cross-section B-B in FIGS. 2B and 2C. A Damascene process can form the bottom portion 204C. The passivation layer 210 and refractory metal caps 211 (comprised of CoWP, W, or TaN, for example) provide passivation between the bottom portion (if Cu is used in the plate) 204C and the lower electrode 206C. The etch processes associated with the formation of the bottom electrode 206C contains reactive gases (F, Cl, $O_2$) that can corrode the Cu in the bottom portion 204C. The refractory metal capping layer 211, allows etching to occur down to bottom portion (plate) 204C (to provide electrical continuity between 206C and 204C), without causing corrosion of the Cu in bottom portion (plate) 204C. In FIG. 2B a series of wedges form the upper portion of the lower electrode 206C, and are terminated in the bottom portion 204C. The wedges of the lower electrode 206C are completely surrounded by high k dielectric 214 and the upper electrode 226C. As previously stated, a novel feature of the present invention allows for the overlap of the upper electrode 226C along the entire height of the lower electrode 206C wedges. In FIG. 2C, an array of pillars form the upper portion of the lower electrode 206C. In this embodiment the upper electrode 226C also completely surrounds the lower electrode pillar array 206C that is covered by the dielectric layer 214. The pillar arrangement provides even more overlap area between the lower and upper electrodes and an even higher specific capacitance then the other aforementioned MIM capacitor designs. The lower electrode pillar array 206C is shown with a square cross-section, however other shapes (e.g. circular) can be used as well.

Finally, FIGS. 3A-3C illustrate an alternative embodiment of the structure of 1J. In the integrated circuit 300 of FIG. 3A the upper electrode 340C is formed during the formation of the third metallization layer 340, which allows the lower electrode 306C to extend to the full height of the second dielectric layer 312. The additional height of the lower electrode 306C contributes to a higher specific capacitance of the MIM capacitor 350, by increasing the amount of overlap between the upper electrode 340C and the lower electrode 306C that is covered by dielectric layer 314. If the bottom portion 304C of the lower electrode 306C is formed in the first dielectric layer 302 the wedge and pillar MIM capacitor designs can be implemented as shown in the top down views of cross-section C-C of FIG. 3A in FIGS. 3B and 3C respectively. If the bottom portion 304C is not formed in the first dielectric layer 302, a MIM capacitor (not shown) with interleaved fingers of the lower and upper electrodes can be implemented (as was shown in FIG. 1K), with a higher specific capacitance then the embodiment of FIG. 1K.

The introduction of self-assembled polymer templates to the etching process facilitates the formation of pillar arrays with sub-lithographic dimensions and can further increase the specific capacitance of MIM capacitors employing a pillar grid array. Self-assembling polymer films provide an alternative to conventional photoresists for patterning at nanometer-scale dimensions. Diblock copolymers spontaneously organize into a dense lattice of hexagonally arranged cylindrical pores. The arrangement of cylindrical pores can be utilized as a mask to form the pillar array. (Additional information in this regard may be found in "Process Integration of Self-assembled Polymer Templates Into Silicon Nanofabrication", Journal of Vacuum Science and Technology, November/December 2002, pp. 2788-2792, the contents of which are incorporated herein by reference).

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A method of forming a metal-insulator-metal (MIM) capacitor, said method comprising:
   forming a first metallization layer in a first dielectric layer;
   forming a first passivation layer on top of the first dielectric layer;
   forming a planar conductive layer above the first passivation layer;
   patterning and selectively removing portions of the planar conductive layer in designated areas to form a set of conductive features electrically coupled at one end;

forming a second dielectric layer over the first passivation layer and enclosing the set of conductive features;

patterning and selectively removing first portions of the second dielectric layer to expose the set of conductive features;

conformally coating the set of conductive features and the partially exposed first passivation layer with a high dielectric constant coating;

patterning and selectively removing second portions of the second dielectric layer to form vias;

patterning and selectively removing third portions of the second dielectric layer to form trenches;

performing a dual-Damascene process to form a second metallization layer in the trenches and vias and to form an upper conductive surface above the high dielectric constant coating disposed above the set of conductive features; and wherein the set of conductive features forms a lower electrode, and the upper conductive surface forms an upper electrode of the MIM capacitor.

2. The method of claim 1 wherein said first and said second dielectric layers comprise one or more of $SiO_2$ and SiCOH.

3. The method of claim 1 wherein said first and said second metallization layers comprise one or more of Al, Cu, Ti, and Ta.

4. The method of claim 1 wherein said forming of the first metallization layer further comprises the formation of a conductive plate in the first dielectric layer by a dual-Damascene process below the area designated for the formation of the MIM capacitor.

5. The method of claim 1 wherein said patterning and selectively removing the conductive layer in designated areas to form the set of conductive features is performed with a nano-template.

6. The method of claim 5 wherein the nano-template is formed with di-block copolymers.

7. The method of claim 1 wherein said selective removing of portions of the planar conductive layer, and first, second and third portions of the second dielectric layer, are performed by reactive ion etching (RIE).

8. The method of claim 1 wherein chemical vapor deposition is used to apply the high dielectric constant coating.

9. The method of claim 1 wherein physical vapor deposition is used to dispose the planar conductive layer.

10. The method of claim 1 further comprising forming a second passivation layer over the second metallization layer.

11. The method of claim 10 wherein said first and second passivation layers comprise one or more of SiC and $Si_3N_4$.

12. The method of claim 10 wherein said first and second passivation layers serve as an etch stop.

* * * * *